(12) United States Patent
Okuda et al.

(10) Patent No.: US 6,734,814 B2
(45) Date of Patent: May 11, 2004

(54) MODULATOR

(75) Inventors: Takashi Okuda, Tokyo (JP); Toshio Kumamoto, Tokyo (JP); Yasuo Morimoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/167,460

(22) Filed: Jun. 14, 2002

(65) Prior Publication Data

US 2003/0117306 A1 Jun. 26, 2003

(30) Foreign Application Priority Data

Dec. 25, 2001 (JP) .......................... 2001-391577

(51) Int. Cl.[7] .............................................. H03M 3/00
(52) U.S. Cl. ...................... 341/143; 341/144; 341/155
(58) Field of Search ................ 341/143, 144, 341/155, 118, 120

(56) References Cited

U.S. PATENT DOCUMENTS

| | | | | |
|---|---|---|---|---|
| 5,760,722 A | * | 6/1998 | Harris et al. | 341/143 |
| 5,877,716 A | * | 3/1999 | Tagami | 341/143 |
| 5,982,315 A | * | 11/1999 | Bazarjani et al. | 341/143 |
| 6,057,792 A | * | 5/2000 | Eastty et al. | 341/143 |
| 6,061,008 A | * | 5/2000 | Abbey | 341/143 |
| 6,408,031 B1 | * | 6/2002 | Hendricks | 375/247 |

FOREIGN PATENT DOCUMENTS

JP         10-322220        12/1998

OTHER PUBLICATIONS

Akira Yukawa, "Modulation Technology for Over Sampling A–D Converter", in Over Sampling A–D Conversion Technology (Chapter 3), Dec. 25, 1990, pp. 23–40, Nikkei Business Publications, Inc., Japan.

Steven R. Norsworthy et al. eds., Delta–Sigma Data Converters, 1997, pp. 176–177, Institute of Electrical and Electronics Engineers (IEEE), New York, NY.

* cited by examiner

Primary Examiner—Michael J. Tokar
Assistant Examiner—Linh V Nguyen
(74) Attorney, Agent, or Firm—Burns, Doane, Swecker & Mathis, L.L.P.

(57) ABSTRACT

In a modulator, an attenuator attenuates an input signal, a delay element gives a delay of 1 sample period to the attenuated signal, an adder subtracts a quantized signal that has been fed back with a delay of 1 sample period, from the delayed signal, two or more integrators integrate a result of the subtraction, an adder which adds outputs of the respective integrators and the attenuated signal, and a quantizer quantizes a result of the addition, outputs a result of the quantization as an output signal and feeds back the output signal to the subtractor.

10 Claims, 9 Drawing Sheets

🖾 : INSERTED BLOCK

▨ : INSERTED BLOCK

MODULATOR

FIELD OF THE INVENTION

The present invention relates to a over-sampling modulator that has been widely used as the A/D converter and the D/A converter for audio band. More particularly, this invention relates to the modulator with a feed-forward configuration that can improve the frequency characteristics of a signal transfer function.

BACKGROUND OF THE INVENTION

A conventional modulator will be explained first. At present, the over-sampling delta-sigma conversion system has been widely used in the A/D or D/A converters for the audio band. FIG. 13 is a diagram that shows a configuration of the modulator with a conventional feed-forward configuration that employs the over-sampling delta-sigma conversion system. The reference number 101 denotes an attenuator block (b), 102 and 105 denote adders (Add), 103 and 104 denote integrators (Int), 106 denotes a quantizer (Q), and 107 denotes a delay element ($z^{-1}$).

The attenuator block 101 is the first component provided at the signal entry side of the modulator to prevent an input of over-amplitude. In other words, when the modulator becomes in a higher order configuration, number of stages of integrators increases, and the amplitude becomes large at the final stage. Therefore, the attenuator block is essential in order to prevent oscillation.

Operation of the conventional modulator will now be explained. According to the feed-forward system, the adder 102 subtracts a quantized signal that has a delay of 1 sample period, from a signal output from the attenuator block 101. The two-stage integrators integrate a result of this subtraction, and the adder 105 adds respective outputs of these two-stage integrators. The quantizer 106 quantizes a result of this addition. A result of the quantization (an input signal component+ quantizing noise) is fed back to the adder 102 via the delay element 107.

This conventional modulator modulates quantizing noise according to the order of the modulator. In other words, the modulator improves SNR (Signal to Noise Ratio) characteristic by concentrating a frequency distribution of the quantizing noise to a high area, and by minimizing the influence of noise in a low-frequency area (refer to FIG. 14).

However, according to the conventional modulator, the frequency characteristics of a signal transfer function (STF) have an inclination as shown by the following equation (1), and a peaking or attenuation may occur in a high area.

$$Y = \{bX - z^{-1}Y\}\frac{1}{1-z^{-1}}\left\{1 + \frac{1}{1-z^{-1}}\right\} + q \quad (1)$$
$$Y\left[(1-z^{-1})^2 + z^{-1}\{(1-z^{-1})+1\}\right] = bX\{(1-z^{-1})+1\} + (1-z^{-1})^2 q$$
$$Y = bX + b(1-z^{-1})X + (1-z^{-1})^2 q$$

In the equation (1), $bX+b(1-z^{-1})X$ expresses the above frequency characteristics.

Therefore, according to the conventional modulator, there has been a problem that it is necessary to provide a correction filter before or after the modulator, in order to correct the frequency characteristics within a signal area when the signal area extends to a higher frequency band.

SUMMARY OF THE INVENTION

It is an object of the invention to provide a modulator that has a feed-forward configuration which can hold the frequency characteristics of a signal transfer function at a constant level, based on an insertion of a simple circuit block.

The modulator according to the present invention employs an over-sampling delta-sigma conversion system. The modulator comprises an attenuating unit which attenuates an input signal to produce an attenuated signal, a delay unit which gives a delay of 1 sample period to the attenuated signal to produce a delayed signal, a subtracting unit which subtracts a quantized signal that has been fed back with a delay of 1 sample period from the delayed signal to produce a subtracted signal, integrating units provided in n-stages, where n is an integer is equal to or larger than 2, which integrate the subtracted signal to produce integrated signal, an adding unit which adds the integrated signal output from each integrating unit and the attenuated signal to produce an added signal, and a quantizing unit which quantizes the added signal to produce an output signal, outputs the output signal and feeds back the output signal to the subtracting unit.

Other objects and features of this invention will become apparent from the following description with reference to the accompanying drawings.

DETAILED DESCRIPTIONS

Embodiments of the modulator, the A/D converter, and the D/A converter according to the present invention will be explained in detail with reference to the accompanying drawings. It should be noted that the present invention is not limited by these embodiments.

Figure 1:
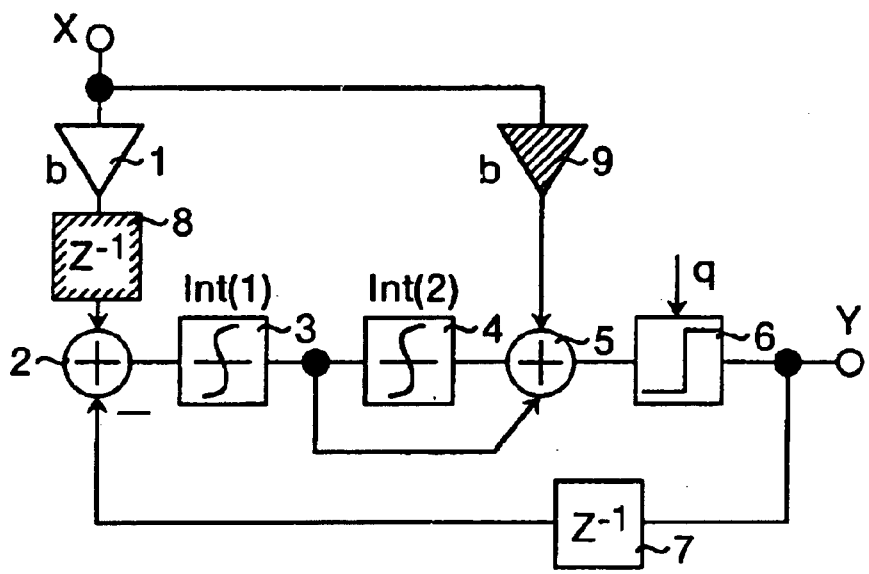
FIG. 1 is a diagram that shows a configuration of the modulator according to the first embodiment of the present invention.

FIG. 1 is a diagram that shows a configuration of the modulator according the first embodiment of the present invention. This modulator has a feed-forward configuration which employs an over-sampling delta-sigma conversion system. In FIG. 1, the reference number 1 denotes an attenuator block (b (1)), 2 and 5 denote adders, 3 denotes an integrator (Int (1)), 4 denotes an integrator (Int (2)), 6 denotes a quantizer, 7 and 8 denote delay elements ($z^{-1}$) and 9 denotes an attenuator block (b (2)) that has the same value as that of the attenuator block 1. The components that have been shaded are the components that were not there in the conventional configuration ("inserted block").

The attenuator block 1 is provided at the entrance of the modulator, in order to prevent an input of an over-amplitude. In other words, when the modulator becomes in a higher order configuration, number of stages of integrators increases, and the amplitude becomes large at a final stage. Therefore, the attenuator block is essential in order to prevent oscillation.

Operation of the modulator shown in FIG. 1 will now be explained. The attenuator block 1 attenuates an input signal X. The adder 2 subtracts a quantized signal that has been given a delay of 1 sample period (an output of a delay element 7: $z^{-1}Y$), from a signal that has been obtained by giving a delay of 1 sample period to an attenuated signal bX (an output of the delay element 8: $bz^{-1}X$). The two-stage integrators integrate a result of this subtraction. The adder 5 adds outputs of respective two-stage integrators, and the signal bX that has been obtained by attenuating the input signal X with the attenuator block 9. The quantizer 6 quantizes a result of this addition. The quantizer 6 outputs the result of this quantization as an output signal Y. The quantizer 6 also feeds back this quantization result Y to the the adder 2 via the delay element 7.

The output signal Y of the modulator can be expressed as the following equation (2). In this equation, q represents a quantization error.

$$Y = \{bz^{-1}X - z^{-1}Y\}\frac{1}{1-z^{-1}}\left\{1 + \frac{1}{1-z^{-1}}\right\} + bX + q \quad (2)$$

$$Y[(1-z^{-1})^2 + z^{-1}\{(1-z^{-1})+1\}] =$$

$$bz^{-1}X\{(1-z^{-1})+1\} + b(1-z^{-1})^2 X + (1-z^{-1})^2 q$$

$$Y[(1-z^{-1})^2 + z^{-1}\{(1-z^{-1})+1\}] =$$

$$b[(1-z^{-1})^2 + z^{-1}\{(1-z^{-1})+1\}]X + (1-z^{-1})^2 q$$

$$Y = bX + (1-z^{-1})^2 q$$

As explained above, the modulator according to the first embodiment modulates quantizing noise according to the order of the modulator. In other words, the modulator improves the SNR by concentrating a frequency distribution of the quantizing noise to a high area, and by minimizing the influence of noise in a low-frequency area.

Further, the modulator holds the frequency characteristics of a signal transfer function at a constant level, based on an insertion of a simple circuit block (refer to the equation (2)). In other words, the frequency characteristics of a signal transfer function are held at a constant level, by inputting the signal $bz^{-1}X$ to the adder 2 via the delay element 8, and inputting the signal bX that has been attenuated by the attenuator block 9, to the adder 5. Therefore, according to the modulator of the first embodiment, it is possible to prevent a peaking or attenuation in a higher frequency band.

Figure 2:
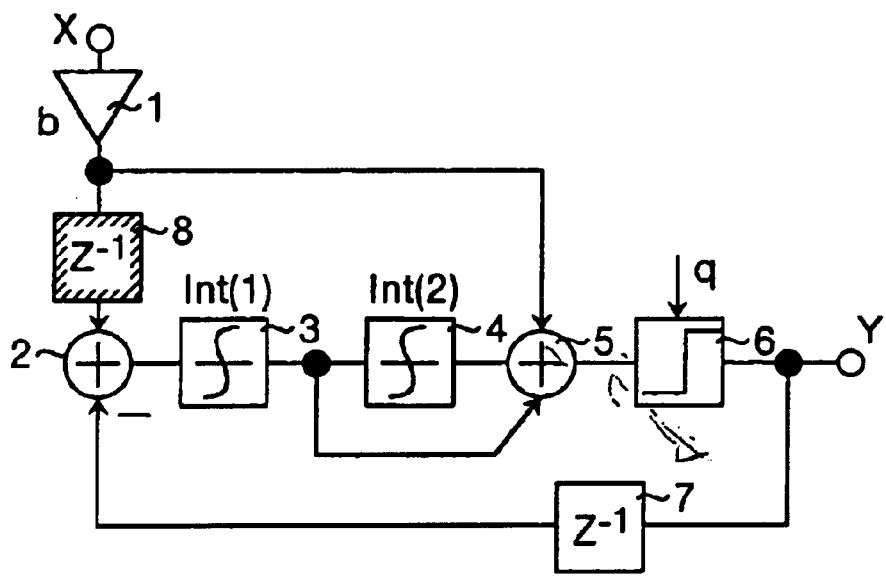
FIG. 2 is a diagram that shows a modification of the modulator shown in FIG. 1.

Although FIG. 1 shows attenuator blocks having same values, it is not limited to this configuration. As shown in FIG. 2, it is also possible to input the signal bX that has been attenuated by the attenuator block 1, to the adder 5. Effects similar as the modulator shown in FIG. 1 are obtained by the modulator shown in FIG. 2. In addition, since lesser components are required, the scale of the circuit can be reduced.

Figure 3:
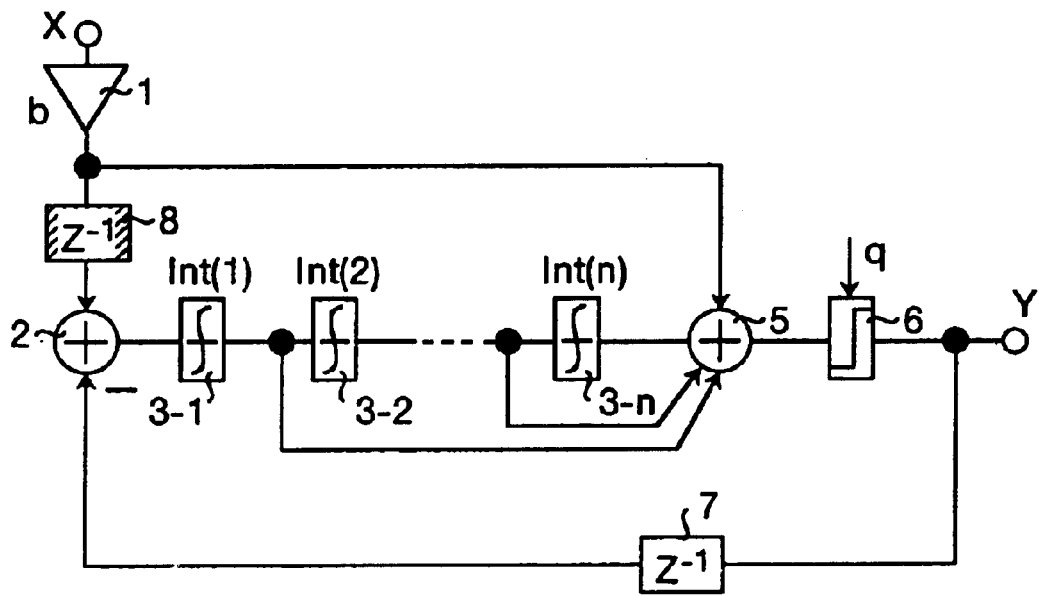
FIG. 3 is a diagram that shows a configuration of the modulator according to the second embodiment of the present invention.

FIG. 3 is a diagram that shows a configuration of the modulator according the second embodiment of the present invention. The reference numbers 3-1, 3-2, ..., 3-n denote integrators (Int (1), Int (2), ..., and Int (n)). Components that are similar in configuration or perform similar functions to the components shown in FIG. 1 have been attached with like reference numbers, and their explanation will be omitted. Although only one attenuator block is shown in FIG. 3, it is needless to show that two attenuator blocks may be provided as shown in FIG. 1.

Figure 4:
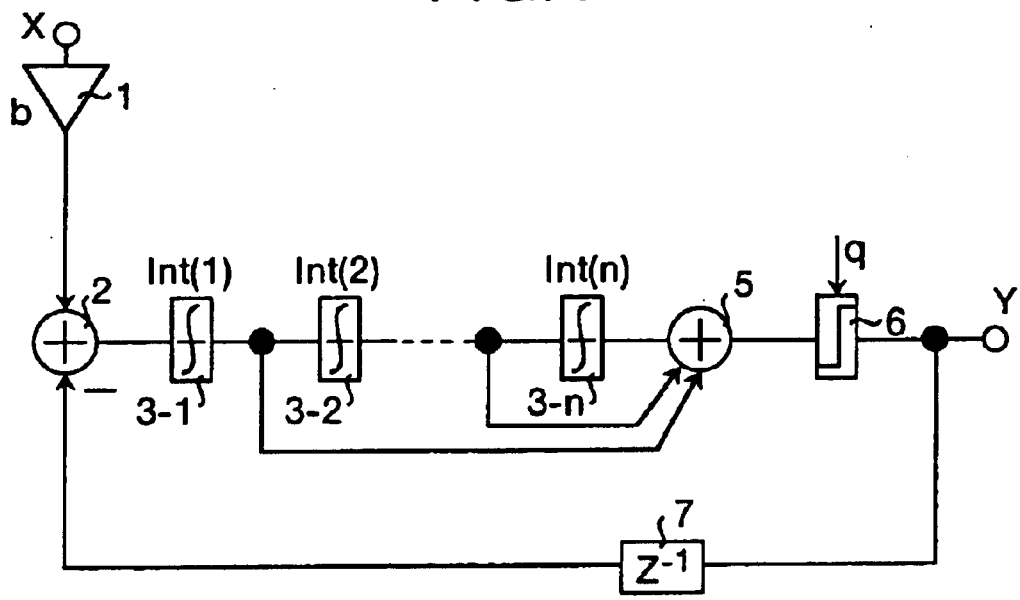
FIG. 4 is a diagram that shows a configuration of a conventional n-order modulator.

Before explaining the operation of the modulator according to the second embodiment, an example of a conventional high-order (n-order) modulator will be explained. FIG. 4 is a diagram that shows a configuration of a conventional n-order modulator. In this conventional n-order modulator, the adder 2 subtracts a quantized signal that has been given a delay of 1 sample period (an output of the delay element 7: $z^{-1}Y$), from an attenuated signal bX. N-stage integrators integrate a result of this subtraction. The adder 5 adds outputs of these respective n-stage integrators.

The output signal Y of the modulator shown in FIG. 4 can be expressed by the following equation (3).

$$Y = \{bX - z^{-1}Y\}\frac{1}{1-z^{-1}} \quad (3)$$

$$\left\{1 + \frac{1}{1-z^{-1}} + \frac{1}{(1-z^{-1})^2} + \ldots + \frac{1}{(1-z^{-1})^{n-1}}\right\} + q$$

$$Y[(1-z^{-1})^n + z^{-1}\{(1-z^{-1})^{n-1} + (1-z^{-1})^{n-2} +$$

$$(1-z^{-1})^{n-3} + \ldots + 1\}] =$$

$$b\{(1-z^{-1})^{n-1} + (1-z^{-1})^{n-2} + (1-z^{-1})^{n-3} + \ldots + 1\}X +$$

$$(1-z^{-1})^n q$$

$$Y = b\sum_{k=1}^{n}(1-z^{-1})^{k-1}X + (1-z^{-1})^n q$$

Figure 13:
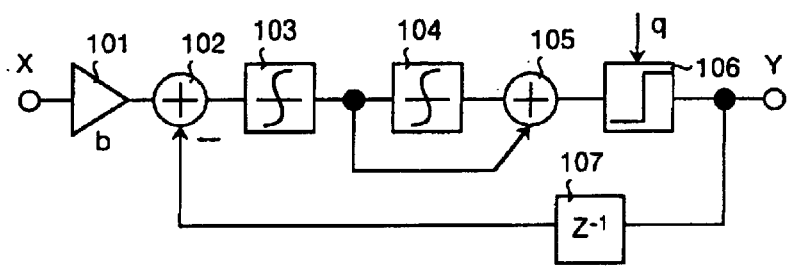
FIG. 13 is a diagram that shows a configuration of a conventional modulator.
Figure 14:
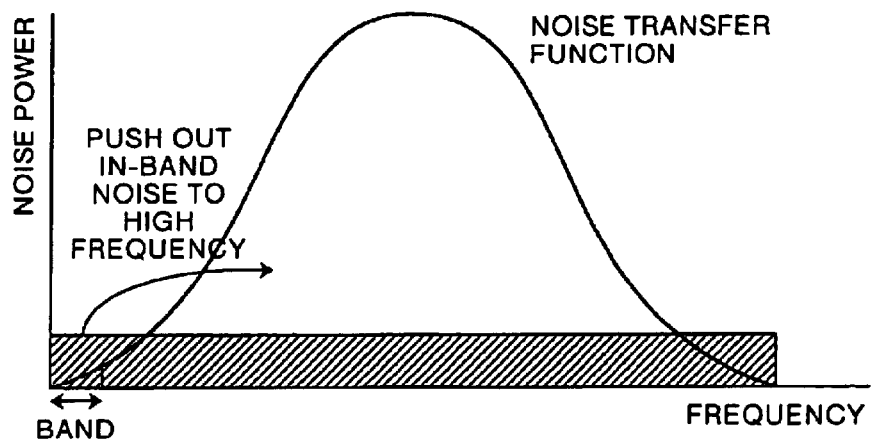
FIG. 14 is a diagram that shows a concept of a modulation of quantizing noise.

In the conventional modulator shown in FIG. 4, n stages of integrators are provided in the configuration shown in FIG. 13 to concentrate the quantizing noise to a higher frequency band. An attempt has been made to realize high precision based on this configuration. However, the frequency characteristic of the signal transfer function (STF) according to this modulator has an inclination, and peaking or attenuation may occur in a high frequency area. Moreover, there is a problem that the frequency characteristics of the STF become complex.

There, the modulator according to the second embodiment realizes high precision. In order to achieve this, as shown in FIG. 3, the modulator is provided with n stages of integrators, a signal $bz^{-1}X$ that has been obtained by giving a delay of 1 sample period to an attenuated signal bX is input to the adder 2. The attenuated signal bX is input to the adder 5.

That is, in the modulator according to the second embodiment, the adder 2 subtracts a quantized signal that has been given a delay of 1 sample period (an output of the delay element 7: $z^{-1}Y$), from a signal that has been obtained by giving a delay of 1 sample period to an attenuated signal bX (an output of the delay element 8: $bz^{-1}X$). The n-stage integrators integrate a result of this subtraction. The adder 5 adds outputs of respective n-stage integrators, and the signal bX that has been obtained by attenuating the input signal X with the attenuator block 1.

The output signal Y of the modulator shown in FIG. 3 can be expressed by the following equation (4).

$$Y = \{bz^{-1}X - z^{-1}Y\}\frac{1}{1-z^{-1}} \qquad (4)$$

$$\left\{1 + \frac{1}{1-z^{-1}} + \frac{1}{(1-z^{-1})^2} + \ldots + \frac{1}{(1-z^{-1})^{n-1}}\right\} + bX + q$$

$$Y[(1-z^{-1})^n + z^{-1}\{(1-z^{-1})^{n-1} + (1-z^{-1})^{n-2} +$$

$$(1-z^{-1})^{n-3} + \ldots + 1\}] =$$

$$bz^{-1}\{(1-z^{-1})^{n-1} + (1-z^{-1})^{n-2} + (1-z^{-1})^{n-3} + \ldots + 1\}X +$$

$$b(1-z^{-1})^n X + (1-z^{-1})^n$$

$$Y[(1-z^{-1})^n + z^{-1}\{(1-z^{-1})^{n-1} + (1-z^{-1})^{n-2} +$$

$$(1-z^{-1})^{n-3} + \ldots + 1\}] =$$

$$b[(1-z^{-1})^n + z^{-1}\{(1-z^{-1})^{n-1} + (1-z^{-1})^{n-2} +$$

$$(1-z^{-1})^{n-3} + \ldots + 1\}]X + (1-z^{-1})^n q$$

$$Y = bX + (1-z^{-1})^n q$$

As explained above, the modulator according to the second embodiment, in comparison to the first embodiment, further improves the SNR, by concentrating a frequency distribution of the quantizing noise to a higher frequency band, and by minimizing the influence of noise in a low-frequency area.

Further, the modulator holds the frequency characteristics of a signal transfer function at a constant level, based on an insertion of a simple circuit block (refer to the equation (4)). In other words, the frequency characteristics of a signal transfer function are held at a constant level, by inputting the signal $bz^{-1}X$ to the adder 2 via the delay element 8, and inputting the signal bX that has been attenuated by the attenuator block 1, to the adder 5. Based on this, it is possible to realize high precision of the modulator.

Figure 5A:
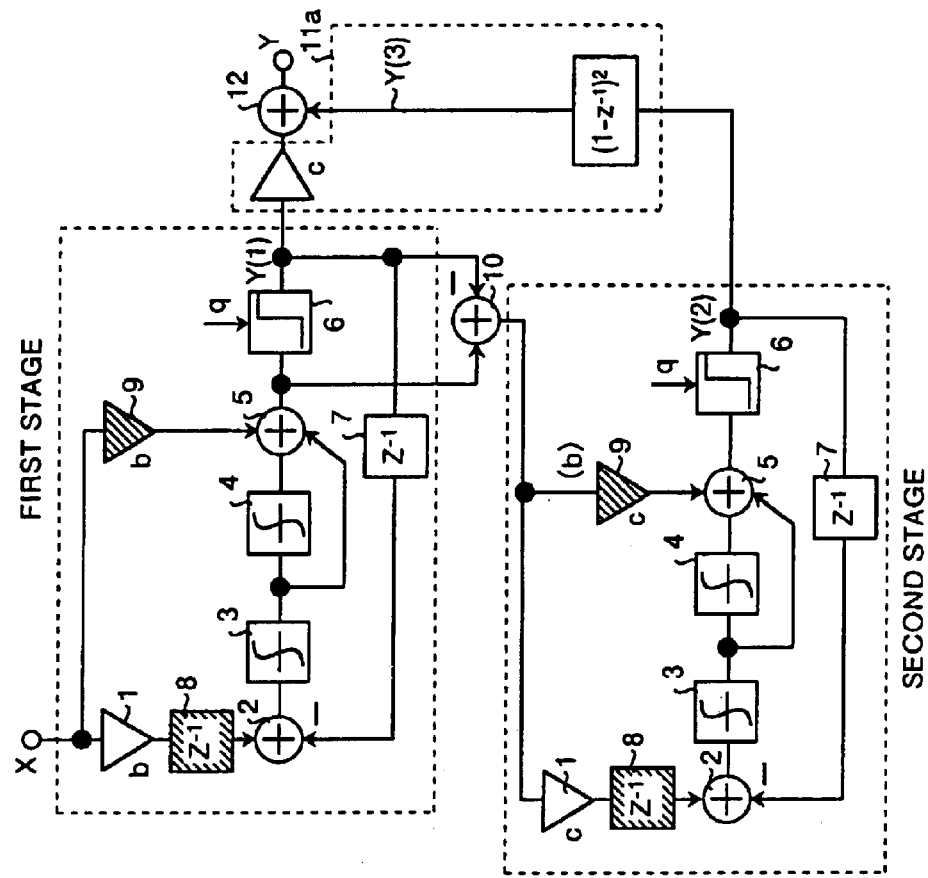
FIG. 5A and FIG. 5B are diagrams that show configurations of the modulator according to the third embodiment of the present invention.
Figure 5B:
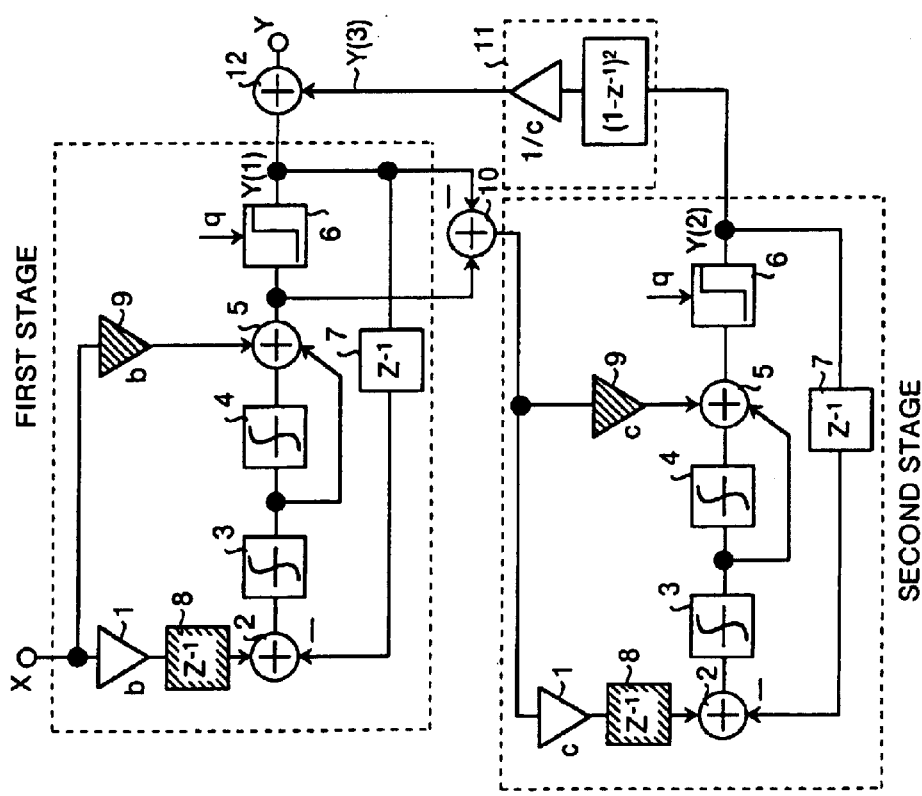

FIG. 5A shows a configuration of the modulator according the third embodiment of the present invention. FIG. 5B shows a modification of the modulator shown in FIG. 5A. The reference numbers 10 and 12 denote adders, and 11 denotes a correction logic section. Like reference numbers have been attached to components that are similar in configuration or perform similar functions to the components shown in FIG. 1 to FIG. 4, and an explanation of such components is omitted.

Figure 6:
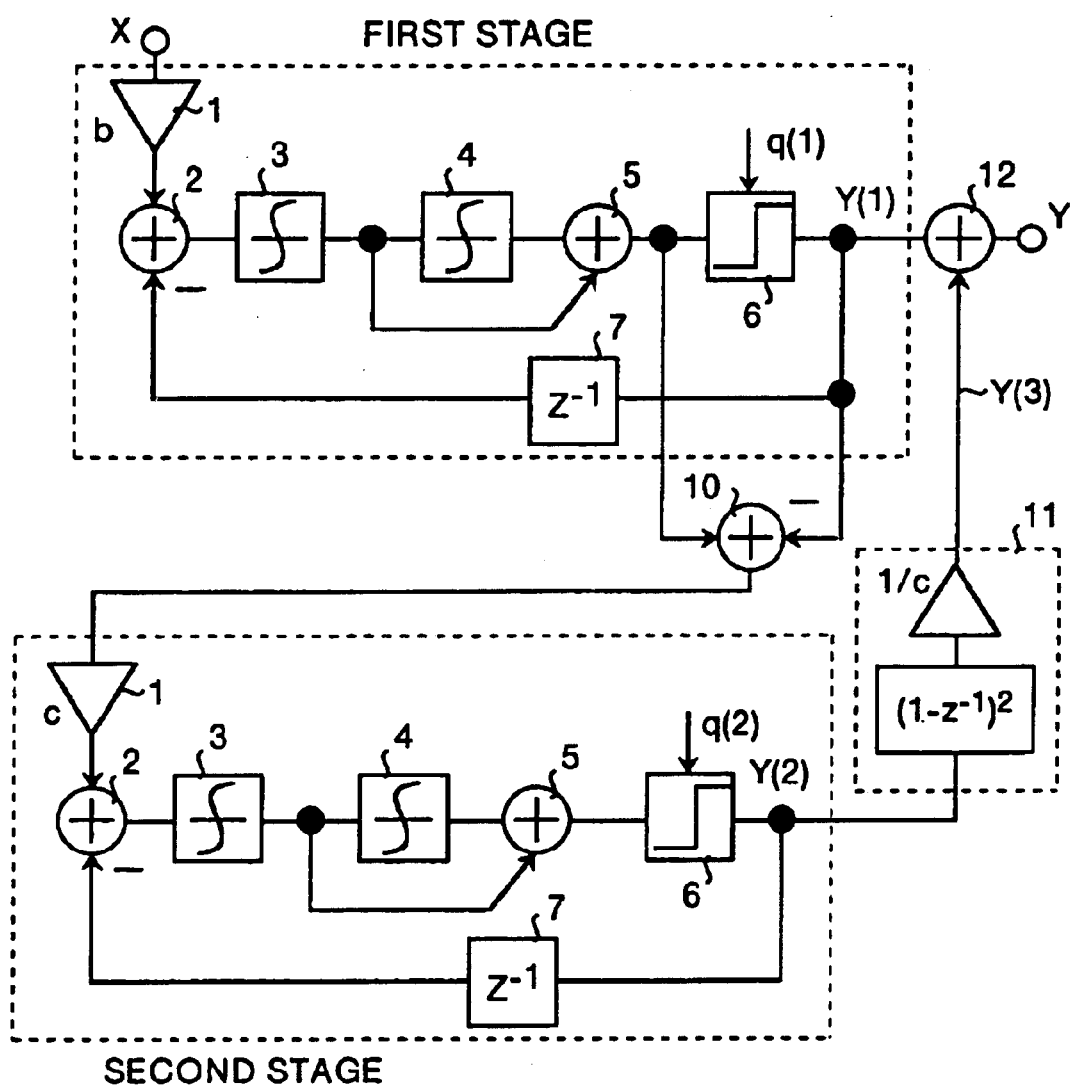
FIG. 6 is a diagram that shows a configuration of a conventional modulator in cascade connection.

Before explaining the operation of the modulator according to the third embodiment, an example of a conventional modulator in cascade connection will be explained. FIG. 6 is a diagram that shows a configuration of a conventional modulator in cascade connection. The conventional modulator shown in FIG. 6 first outputs a signal Y(1) at a first stage. The adder 2 subtracts a quantized signal $z^{-1}Y(1)$ that has been given a delay of 1 sample period, from an attenuated signal bX. Two-stage integrators integrate a result of this subtraction. The adder 5 adds outputs of the two-stage integrators. The quantizer 6 quantizes a result of this addition (a quantization result: Y(1)). The quantizer 6 also feeds back this quantization result Y(1) to the input of the adder 2 via the delay element 7.

The output signal Y(1) of the first stage shown can be expressed by the following equation (5).

$$Y(1) = bX + b(1-z^{-1})X + (1-z^{-1})^2 q(1) \qquad (5)$$

Moreover, the second stage outputs a signal Y(2). The second stage receives the quantization error q(1) that is an output of the first stage (a difference between the input and the output of the quantizer 6). The adder 2 subtracts a quantized signal $z^{-1}Y(2)$ that has been given a delay of 1 sample period, from a signal cq(1) that has been obtained by attenuating the quantization error. Two-stage integrators 3, 4 integrate a result of this subtraction. The adder 5 adds outputs of the two-stage integrators. The quantizer 6 quantizes a result of this addition (a quantization result: Y(2)). The quantizer 6 also feeds back this quantization result Y(2) to the input of the adder 2 via the delay element 7.

The output signal Y(2) of the second stage can be expressed by the following equation (6).

$$Y(2) = -cq(1) - c(1-z^{-1})q(1) + (1-z^{-1})^2 q(2) \qquad (6)$$

The correction logic section 11 carries out a correction processing shown in the following equation (7) and outputs a signal Y(3).

$$Y(3) = -(1-z^{-1})^2 q(1) - (1-z^{-1})^3 q(1) + \frac{1}{c}(1-z^{-1})^4 q(2) \qquad (7)$$

Finally, an adder 12 adds the signal Y(1) and the signal Y(3), as shown in the equation (8), and outputs the signal Y.

$$Y = Y(1) + Y(3) \qquad (8)$$

$$= bX + b(1-z^{-1})X - (1-z^{-1})^3 q(1) + \frac{1}{c}(1-z^{-1})^4 q(2)$$

As explained above, according to the modulator shown in FIG. 6, the integrators shown in FIG. 13 explained in the conventional technique are simply connected in cascade, and the quantizing noise has been concentrated to a higher frequency band, to realize high precision. However, according to this modulator, the frequency characteristics of the STF has an inclination, and further has a low-order noise-shaping term. Therefore, there arises a problem that it is not possible to obtain sufficient precision. In the equation (8), the portion of $(1-z^{-1})^3 q$ shows the noise-shaping term.

An example of a configuration to realizes high precision of the modulator according to the third embodiment has been shown in FIG. 5A and FIG. 5B. As shown in FIG. 5A, at the first stage, the signal bX that has been obtained by attenuating the input signal X is input to the adder 5. The signal $bz^{-1}X$ that has been obtained by giving a delay of 1 sample period to the attenuated signal bX, is input to the adder 2. At the second stage, the signal cq(1) that has been obtained by attenuating a quantization error q(1) of the first stage, is input to the adder 5. A signal $cz^{-1}q(1)$ that has been obtained by giving a delay of 1 sample period to the attenuated signal cq(1), is input to the adder 2. Here, modulators of the same orders and the same number of bits are used at the first stage and the second stage.

Thus, the modulator in cascade connection according to the third embodiment first outputs a signal Y(1) at the first stage shown in FIG. 5A. The adder 2 subtracts a quantized signal $z^{-1}Y$ that has been given a delay of 1 sample period, from a signal $bz^{-1}X$ that has been obtained by giving a delay of 1 sample period to the attenuated signal bX. The two-stage integrators integrate a result of this subtraction. The adder 5 adds outputs of these respective two-stage integrators, and a signal that has been obtained by attenuating the input signal X with the attenuator block 9. The quantizer 6 quantizes a result of this addition (a quantization result: Y(1)). The quantizer 6 also feeds back this quantization result Y(1) to the input of the adder 2 via the delay element 7.

The output signal Y(1) of the first stage shown in FIG. 5A can be expressed by the following equation (9).

$$Y(1)=bX+(1-z^{-1})^2q(1) \tag{9}$$

The second stage shown in FIG. 5A outputs the signal Y(2). The second stage receives the quantization error q(1) that is an output of the first stage (a difference between the input and the output of the quantizer 6). The adder 2 subtracts a quantized signal $z^{-1}Y(2)$ that has been given a delay of 1 sample period, from a signal $cz^{-1}q(1)$ that has been obtained by giving a delay of 1 sample period to a quantization-error-attenuated signal cq(1). The two-stage integrators integrate a result of this subtraction. The adder 5 adds outputs of respective two-stage integrators, and a signal that has been obtained by attenuating the quantization error with the attenuator block 9. The quantizer 6 quantizes a result of this addition (a quantization result: Y(2)). The quantizer 6 also feeds back this quantization result Y(2) to the input of the adder 2 via the delay element 7.

The output signal Y(2) of the second stage shown in FIG. 5A can be expressed by the following equation (10).

$$Y(2)=-cq(1)+(1-z^{-1})^2q(2) \tag{10}$$

The correction logic section 11 carries out a correction processing shown in the equation (11), and outputs the signal Y(3).

$$Y(3) = -(1-z^{-1})^2 q(1) + \frac{1}{c}(1-z^{-1})^4 q(2) \tag{11}$$

Finally, the adder 12 adds the signal Y(1) and the signal Y(3), as shown in the equation (12), and outputs the signal Y.

$$Y = Y(1) + Y(3) \tag{12}$$
$$= bX + \frac{1}{c}(1-z^{-1})^4 q(2)$$

Thus, the modulator according to the third embodiment, in comparison to the modulator of the first and second embodiments, further improves the SNR, by concentrating a frequency distribution of quantizing noise to a higher frequency band, and by minimizing the influence of noise in a low-frequency area.

Further, the modulator holds the frequency characteristics of a signal transfer function at a constant level, and removes a low-order noise shaping term, based on an insertion of a simple circuit block, as follows. In other words, the modulator of the first stage receives the signal bX that has been obtained by attenuating the input signal X, to the adder 5. Further, the modulator of the first stage receives the signal $bz^{-1}X$ that has been obtained by giving a delay of 1 sample period to the attenuated signal bX, to the adder 2. The modulator of the second stage receives the signal cq(1) that has been obtained by attenuating the quantization error q(1) of the first stage, to the adder 5. Further, the modulator of the second stage receives the signal $cz^{-1}q(1)$ that has been obtained by giving a delay of 1 sample period to the attenuated signal cq(1), to the adder 2. Based on this, it is possible to realize high precision of the modulator.

The configuration of the third embodiment is not limited to that shown in FIG. 5A. For example, it is also possible to obtain a similar effect to that of the above configuration, when the correction logic section (11a) is changed as shown in FIG. 5B. In this case, the output signal Y can be expressed by the following equation (13).

$$Y=bcX+(1-z^{-1})^4q \tag{13}$$

Figure 7:
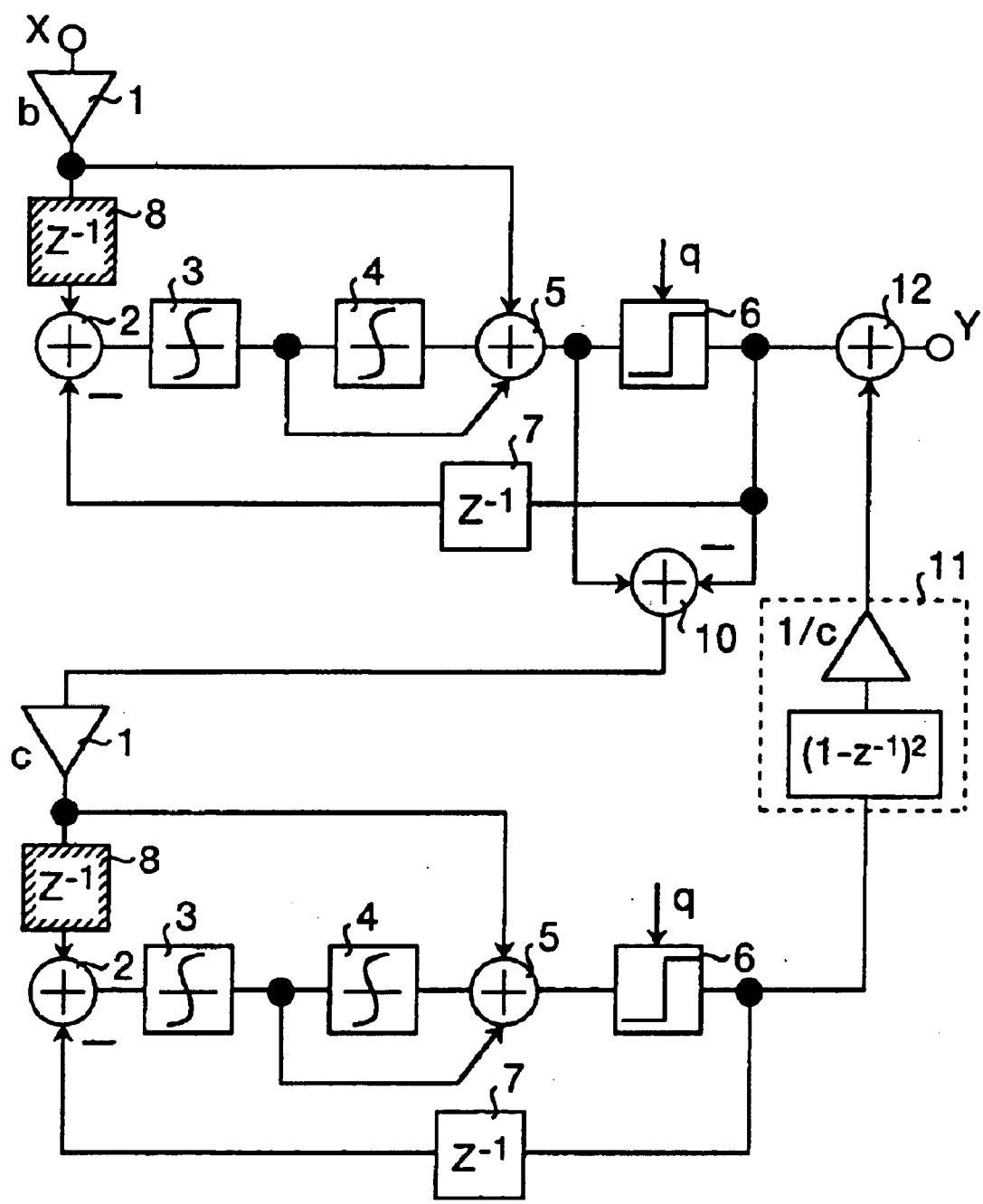
FIG. 7 is a diagram that shows a modification of the modulators shown in FIG. 5A and FIG. 5B.

Although the two attenuator that have the same values are provided in each of the first and second stage modulators as shown in FIG. 5A and FIG. 5B, the configuration is not limited to this. As shown in FIG. 7, it is also possible to input the signal bX that has been attenuated by only one attenuator to the adder 5. In other words, each of the first and second stage modulators may have a configuration such that one attenuator is shared between the two stages of the modulators. With such a configuration, it is possible to obtain a similar effect as the configuration of the first and second embodiments. In addition, since lesser components are required, it becomes possible to reduce the circuit scale.

Figure 8:
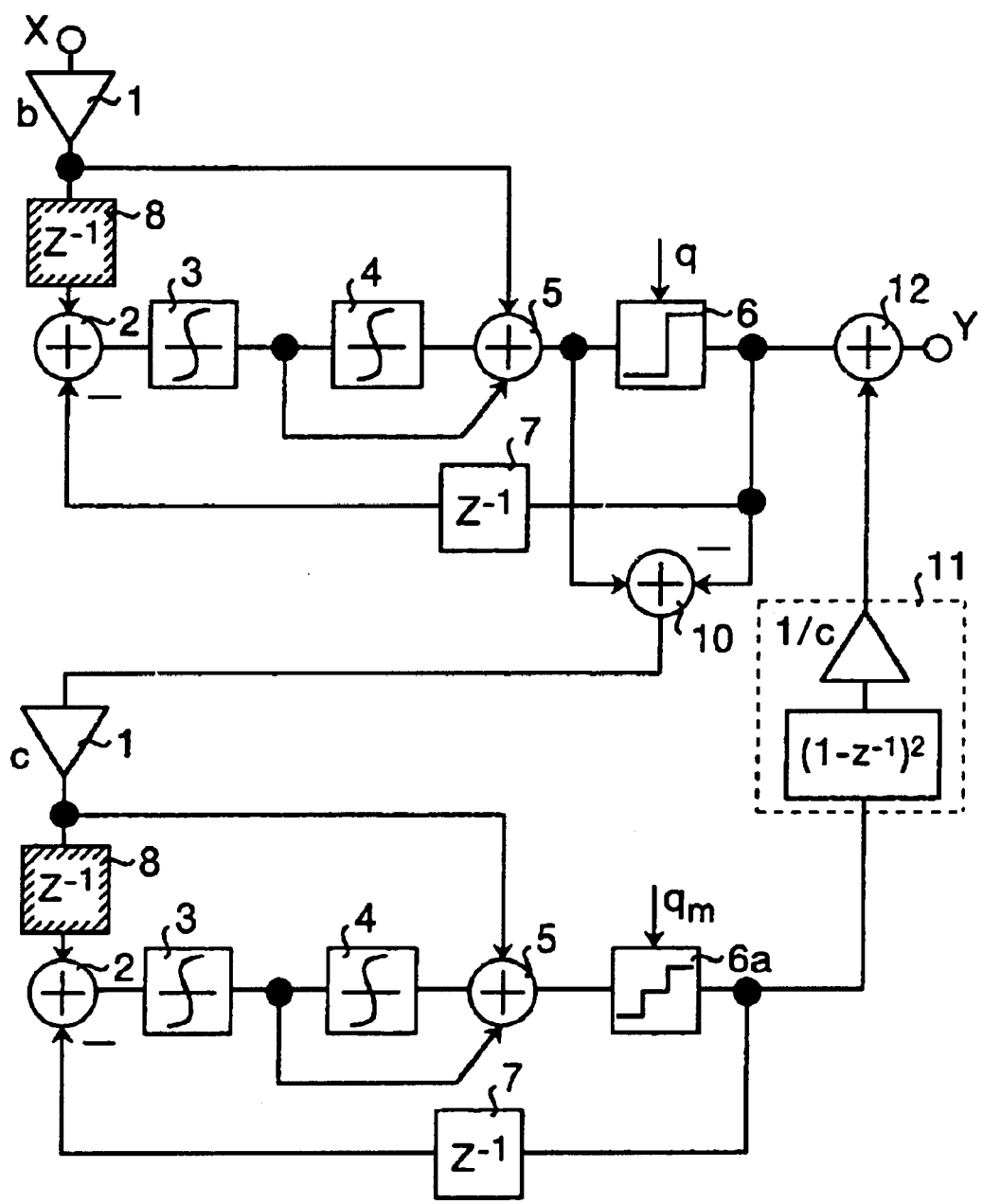
FIG. 8 is a diagram that shows a modification of the modulators shown in FIG. 5A and FIG. 5B.

Further, same number of bits of the quantizers are set in the first and second stage modulators shown in FIG. 5A, FIG. 5B, and FIG. 7. However, as shown in FIG. 8, it is also possible to set the number of bits of the quantizer 6a of the second stage modulator larger than the number of bits of the quantizer 6 of the first stage modulator. This configuration further improve the precision of the modulator. In this case, the output signal Y can be expressed by the following equation (14).

$$Y = bX + \frac{1}{c}(1-z^{-1})^4 q_m \tag{14}$$

Figure 9:
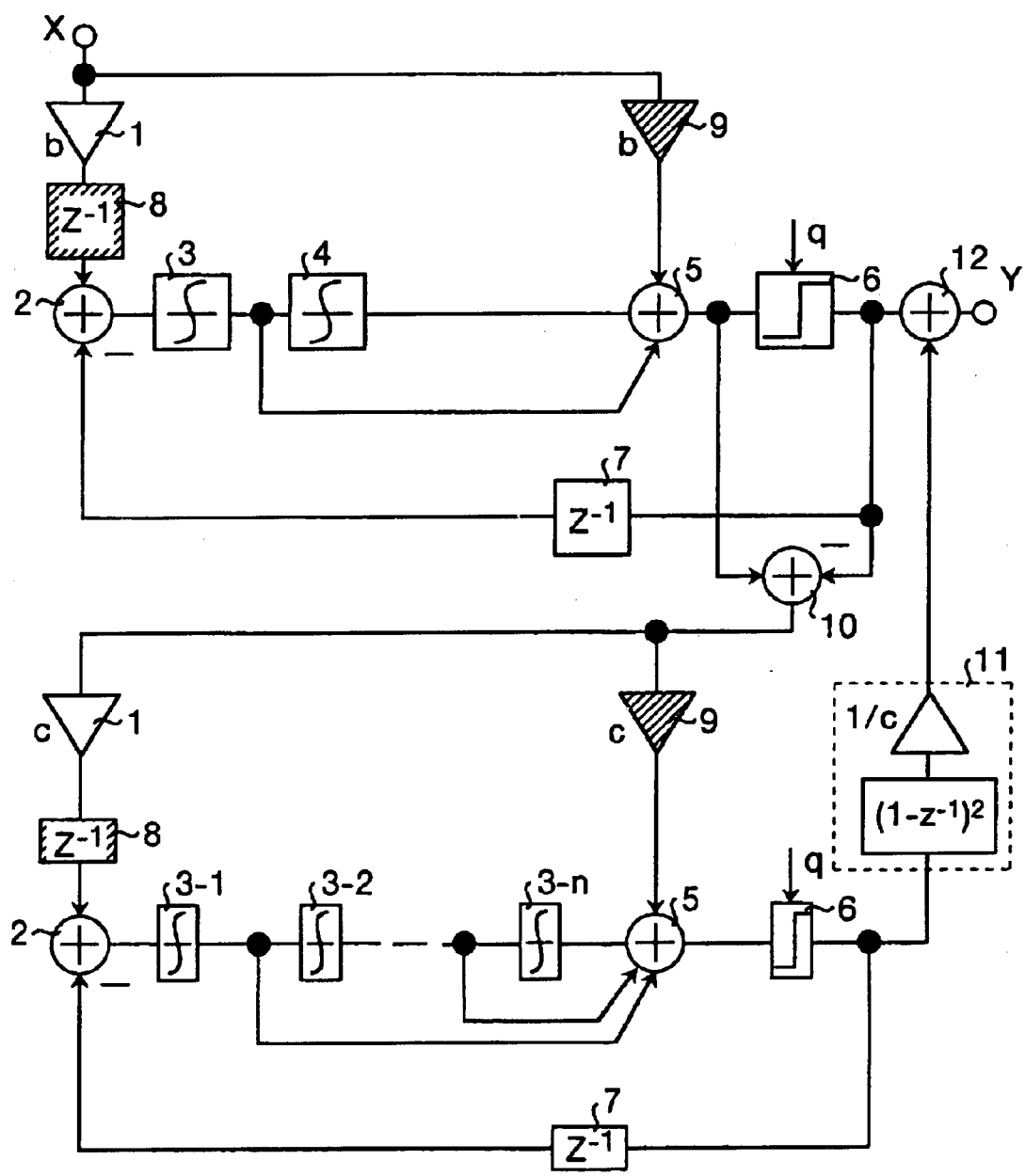
FIG. 9 is a diagram that shows a modification of the modulators shown in FIG. 5A and FIG. 5B, FIG. 10A and FIG. 10B are diagrams that show configurations of the modulator according to the fourth embodiment of the present invention.

Further, same number of integrates are provided in the first and second stage modulators shown in FIG. 5A FIG. 5B, FIG. 7, and FIG. 8. However, as shown in FIG. 9, it is also possible to different number of integrates in the first and second stage modulators. This configuration further improves the precision of the modulator. In this case, the output signal Y can be expressed by the following equation (15).

$$Y = bX + \frac{1}{c}(1-z^{-1})^{n+2} q \tag{15}$$

Figure 10B:
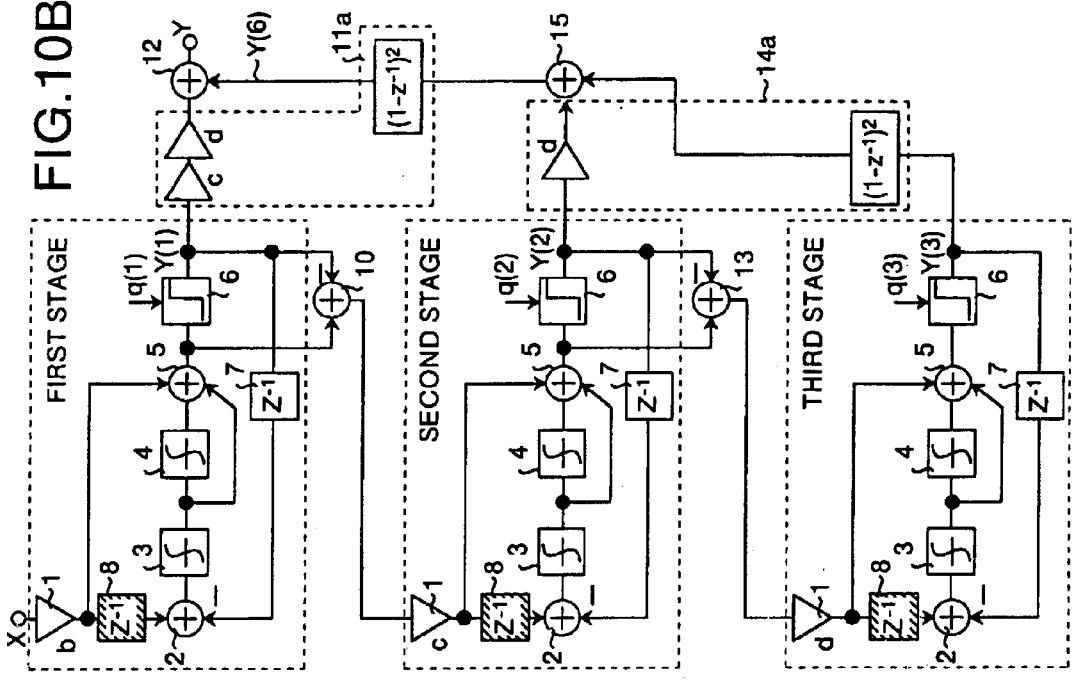
Figure 10A:
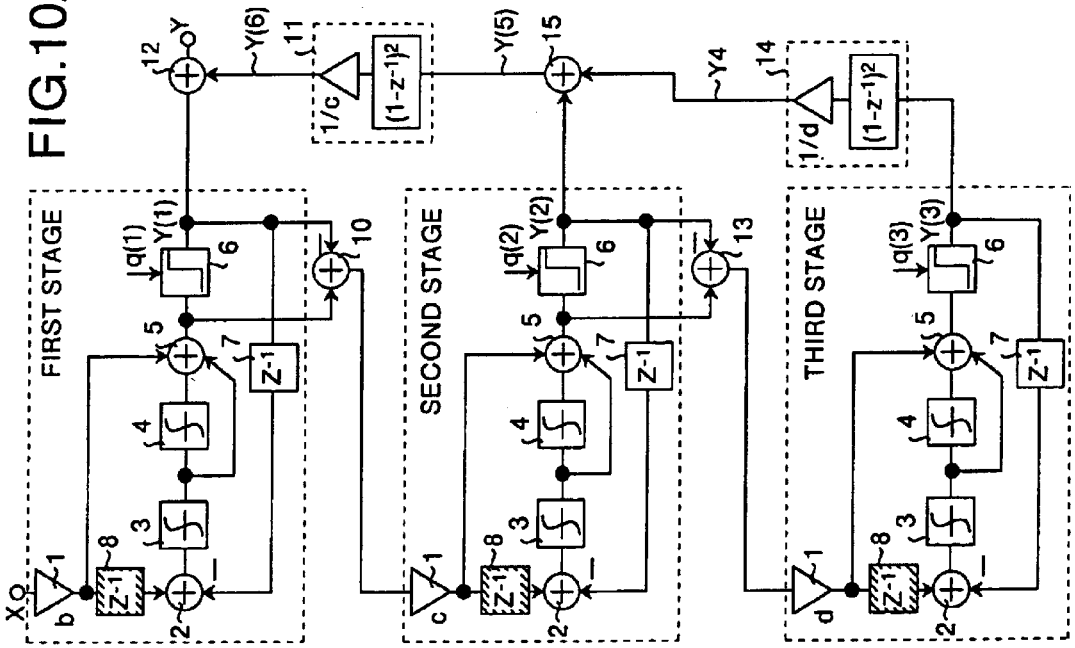

FIG. 10A shows a configuration of the modulator according the fourth embodiment of the present invention. FIG. 10B shows a modification of the modulator shown in FIG. 10A. The reference numbers 13 and 15 denote adders, and 14 denotes a correction logic section. Like reference numbers have been attached to components that are similar in configuration or perform similar functions to the components shown in FIG. 1 to FIG. 9, and an explanation of such components is omitted.

The operation of the modulator of the fourth embodiment will be explained. This modulator has three or more stages of the modulators. For the sake of convenience of the explanation, it will be assumed that three stages of modulator are provided. As shown in FIG. 10A, the first stage modulator ("first stage") receives the signal bX that has been obtained by attenuating an input signal X, to the adder 5. Further, the first stage modulator receives a signal $bz^{-1}X$ that has been obtained by giving a delay of 1 sample period to the attenuated signal bX to the adder 2. The second stage modulator ("second stage") receives a signal cq(1) that has been obtained by attenuating a quantization error q(1) in the first stage modulator, to the adder 5. Further, the second stage modulator receives a signal $cz^{-1}q(1)$ that has been obtained by giving a delay of 1 sample period to the attenuated signal cq(1), to the adder 2. Further, the third stage modulator ("third stage") receives a signal dq(2) that has been obtained by attenuating a quantization error q(2) of the first stage, to the adder 5. Further, the third stage modulator receives a signal $dz^{-1}q(2)$ that has been obtained by giving a delay of 1 sample period to the attenuated signal dq(2), to the adder 2. In this case, modulators of the same number of orders and the same number of bits are used at the first, second, and the third stage modulators.

The modulator in cascade connection according to the fourth embodiment, outputs a signal Y(3) from the third stage modulator, after finishing the operation at the first and second stage modulators. The third stage modulator receives a quantization error q(2) that is an output of the second stage. The adder 2 subtracts a quantized signal $z^{-1}Y(3)$ that has been given a delay of 1 sample period, from a signal $dz^{-1}q(2)$ that has been obtained by giving a delay of 1 sample period to a quantization-error-attenuated signal dq(2). Integrators of a 2-stage configuration integrate a result of this subtraction. The adder 5 adds outputs of these respective two-stage integrators, and a signal that has been obtained by attenuating a quantization error q(3) with the attenuator block 1. A quantizer 6 quantizes a result of this addition (a quantization result: Y(3)). At the same time, the quantizer 6 feeds back this quantization result Y(3) to the input of the adder 2 via a delay element 7.

The output signal Y(3) of the third stage modulator can be expressed by the following equation (16).

$$Y(3) = -dq(2) + (1-z^{-1})^2 q(3) \quad (16)$$

A correction logic section 14 carries out a correction processing shown in the equation (17), and outputs a signal Y(4).

$$Y(4) = -(1-z^{-1})^2 q(2) + \frac{1}{d}(1-z^{-1})^4 q(3) \quad (17)$$

An adder 15 adds the signal Y(2) and the signal Y(4) as shown in the equation (18), and outputs a signal Y(5).

$$Y(5) = -cq(1) + \frac{1}{d}(1-z^{-1})^4 q(3) \quad (18)$$

A correction logic section 11 carries out a correction processing shown in the equation (19), and outputs a signal Y(6).

$$Y(6) = -(1-z^{-1})^2 q(1) + \frac{1}{cd}(1-z^{-1})^6 q(3) \quad (19)$$

Finally, an adder 12 adds the signal Y(1) and the signal Y(6), as shown in the equation (20), and outputs the signal Y.

$$Y = Y(1) + Y(6) \quad (20)$$
$$= bX + \frac{1}{cd}(1-z^{-1})^6 q(3)$$

Thus, the modulator according to the fourth embodiment, in comparison to the modulator according to the first embodiment, improves the SNR, by concentrating a frequency distribution of quantizing noise to a higher frequency band, and by minimizing the influence of noise in a low-frequency area.

Further, it is possible to realize higher precision, based on an insertion of a simple circuit block while maintaining the signal transfer function to a constant value, as follows. In other words, at the first stage, the modulator inputs the signal bX that has been obtained by attenuating the input signal X, to the adder 5. Further, the modulator inputs the signal $bz^{-1}X$ that has been obtained by giving a delay of 1 sample period to the attenuated signal bX, to the adder 2. At the second stage, the modulator inputs a signal cq(1) that has been obtained by attenuating the quantization error q(1) of the first stage, to the adder 5. At the third stage, the modulator inputs the signal dq(2) that has been obtained by attenuating the quantization error q(2) of the second stage, to the adder 5. Further, the modulator inputs the signal $dz^{-1}q(2)$ that has been obtained by giving a delay of 1 sample period to the attenuated signal dq(2), to the adder 2.

The configuration of the fourth embodiment is not limited to that shown in FIG. 10A. For example, it is also possible to obtain a similar effect to that of the above configuration, when the correction logic sections (11a and 14a) are changed as shown in FIG. 10B. In this case, the output signal Y can be expressed by the following equation (21).

$$Y = Y(1) + Y(6) \quad (21)$$
$$= bcdX + (1-z^{-1})^6 q(3)$$

Figure 11:
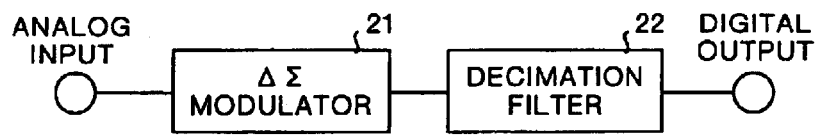
FIG. 11 is a diagram that shows a configuration of the analog/digital (A/D) converter that uses the modulator according to the present invention.

FIG. 11 is a diagram that shows a configuration of an analog/digital (A/D) converter that uses the modulator according to the first to fourth embodiments of the present invention. The reference number 21 denotes the modulator, and 22 denotes a decimation filter.

As explained above, based on the use of the modulators according to the first to fourth embodiments, it is possible to provide an A/D converter that can hold the frequency characteristics of a signal transfer function at a constant level.

Figure 12:
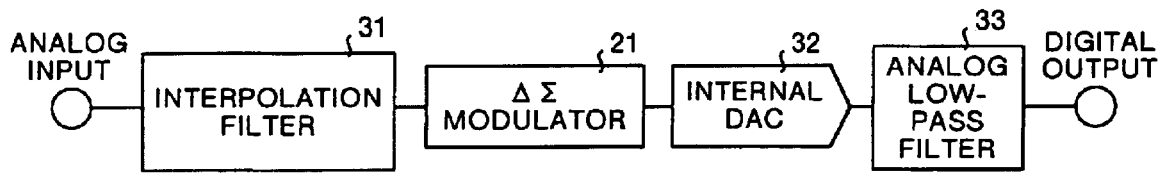
FIG. 12 is a diagram that shows a configuration of the digital/analog (D/A) converter that uses the modulator according to the present invention.

FIG. 12 is a diagram that shows a configuration of the digital/analog (D/A) converter that uses the modulator according to the first to fourth embodiments. The reference number 31 denotes an interpolation filter, 32 denotes an internal DAC (D/A converter), and 33 denotes an analog low-pass filter.

As explained above, based on the use of the modulators according to the first to fourth embodiments, it is possible to provide a D/A converter that can hold the frequency characteristics of a signal transfer function at a constant level.

As explained above, according to the modulator of one aspect of the present invention, it is possible to hold the frequency characteristics of a signal transfer function at a constant level. Therefore, there is an effect that it is possible to prevent a peaking or attenuation in a high area.

According to another aspect of the present invention, at the first stage, a signal that has been obtained by giving a delay of 1 sample period to an attenuated input signal, and a quantized signal that has been given a delay of 1 sample period and that has been fed back, are input to a subtracting unit. Further, outputs of respective integrating units, and the attenuated input signal are input to an adding unit. Further, at other n-th stage, a signal that has been obtained by giving a delay of 1 sample period to a quantization error at a preceding stage after the attenuation, and a quantized signal that has been given a delay of 1 sample period and that has been fed back, are input to a subtracting unit. Further, outputs of respective integrating units, and the quantization error at the preceding stage after the attenuation, are input to the adding unit. Based on this configuration, it is possible to hold the frequency characteristics of a signal transfer function at a constant level, and it is also possible to remove a low-order noise shaping term. Therefore, there is an effect that it is possible to realize higher precision.

According to still another aspect of the present invention, the number of bits of the quantizing unit at the second stage is set larger than the number of bits of the quantizing unit at the first stage. Based on-this, there is an effect that it is possible to further improve the precision of the modulator.

According to still another aspect of the present invention, there is an effect that it is possible to obtain an A/D converter that can hold the frequency characteristics of a signal transfer function at a constant level.

According to still another aspect of the present invention, there is an effect that it is possible to obtain an A/D converter that can hold the frequency characteristics of a signal transfer function at a constant level, and at the same time, that can remove a low-order noise shaping term.

According to still another aspect of the present invention, there is an effect that it is possible to obtain a D/A converter that can hold the frequency characteristics of a signal transfer function at a constant level.

According to still another aspect of the present invention, there is an effect that it is possible to obtain a D/A converter that can hold the frequency characteristics of a signal transfer function at a constant level, and at the same time, that can remove a low-order noise shaping term.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A modulator that employs an over-sampling delta-sigma conversion system, the modulator comprising:
    an attenuating unit which attenuates an input signal to produce an attenuated signal;
    a delay unit which gives a delay of 1 sample period to the attenuated signal to produce a delayed signal;
    a subtracting unit which subtracts a quantitized signal that has been fed back with a delay of 1 sample period from the delayed signal to produce a subtracted signal;
    integrating units provided in n-stages, where n is an integer is equal to or larger than 2, which integrate the subtracted signal to produce an integrated signal;
    an adding unit which adds the integrated signal output from each integrating unit and the attenuated signal to produce an added signal; and
    a quantitizing unit which quantizes the added signal to produce an output signal, outputs the output signal and feeds back the output signal to the subtracting unit.

2. The modulator according to claim 1, wherein the quantitizing unit uses multiple bits.

3. The modulator according to claim 1, wherein the modulator comprises a circuit that performs one or both of conversion and modulation of a signal.

4. A modulation device that employs an over-sampling delta-sigma conversion system, comprising:
    m stages of modulators connected in cascade, where m is an integer, each modulator comprising,
    an attenuating unit which attenuates an input signal to produce an attenuated signal,
    a delay unit which gives a delay of 1 sample period to the attenuated signal to produce a delayed signal,
    a subtracting unit which subtracts a quantitized signal that has been fed back with a delay of 1 sample period from the delayed signal to produce a subtracted signal,
    integrating units provided in n-stages, where n is an integer is equal to or larger than 2, which integrate the subtracted signal to produce an integrated signal,
    an adding unit which adds the integrated signal output from each integrating unit and the attenuated signal to produce an added signal, and
    a quantitizing unit which quantizes the added signal to produce an output signal, outputs the output signal and feeds back the output signal to the subtracting unit,
    wherein a quantization error determined by a modulator at a preceding stage is supplied as the input signal to each modulator at later stages;
    correction units each of which executes a predetermined correction processing to the output signals of the modulator of a corresponding stage to produce correction signals; and
    a first adder which adds all the correction signals, and outputs a result of this addition as the output signal.

5. A modulator that employs an over-sampling delta-sigma conversion system, the modulator comprising:
    an attenuating unit which attenuates an input signal to produce an attenuated signal;
    a first delay unit which gives a delay of 1 sample period to the attenuated signal to produce a first delayed signal;
    a subtracting unit which subtracts a second delayed signal from the first delayed signal to produce a subtracted signal;
    a first integrating unit which integrates the subtracted signal to produce a first integrated signal;
    a second integrating unit which integrates the first integrated signal to produce a second integrated signal;
    an adding unit which adds the first integrated signal, the second integrated signal, and an attenuated input signal to produce an added signal;
    a quantizing unit which quantizes the added signal to produce a quantized signal and outputs the quantized signal as an output signal; and
    a second delay unit which gives a delay of 1 sample period to the quantized signal to produce the second delayed signal and feeds back the second delayed signal to the subtracting unit.

6. The modulator according to claim 5, further comprising:
    a second attenuating unit which attenuates an input signal to produce the attenuated input signal, wherein the attenuated input signal is supplied to the adding unit.

7. The modulator according to claim 5, wherein the attenuated signal outputted from the attenuating unit is supplied to the adding unit as the attenuated input signal.

8. The modulator according to claim 5, wherein the quantizing unit uses multiple bits.

9. The modulator according to claim 5, wherein the modulator comprises a circuit that performs one or both of conversion and modulation of a signal.

10. A modulation device that employs an over-sampling delta-sigma conversion system, the modulator device comprising:

at least two stages of modulators according to claim 5 which are connected in cascade, wherein a quantization error determined by a modulator at a preceding stage is supplied as the input signal to modulator at a later stage;

at least one correction unit, each of which executes a predetermined correction processing to the output signals of the modulator of a corresponding stage to produce correction signals; and a first adder which adds all the correction signals, and outputs a result of this addition as the output signal.

* * * * *